United States Patent [19]

Babcock et al.

[11] Patent Number: 5,890,783
[45] Date of Patent: Apr. 6, 1999

[54] SEMI-MONOCOQUE APPARATUS AND METHOD FOR AN ELECTRONIC DEVICE ENCLOSURE

[75] Inventors: Raymond Floyd Babcock, Stewartville; Stephen Peter Mroz; Kenneth Robert Peters, both of Rochester, all of Minn.

[73] Assignee: International Business Machines Corporation, Armonk, N.Y.

[21] Appl. No.: 864,312

[22] Filed: May 28, 1997

[51] Int. Cl.[6] .................................................. A47B 47/00
[52] U.S. Cl. ................................... 312/265.3; 312/265.4; 312/265.6; 312/223.2
[58] Field of Search ............................. 312/223.2, 257.1, 312/265.1, 265.2, 265.3, 265.4, 265.6, 108

[56] References Cited

U.S. PATENT DOCUMENTS

| | | | |
|---|---|---|---|
| 1,374,868 | 4/1921 | White et al. | 312/265.2 |
| 1,729,475 | 9/1929 | Brainard et al. | 312/265.2 |
| 2,991,140 | 7/1961 | Anderson et al. | 312/265.4 |
| 3,034,844 | 5/1962 | Anderson et al. | 312/265.4 |
| 3,404,931 | 10/1968 | Fall et al. | 312/265.4 |
| 4,692,984 | 9/1987 | McKernan et al. | 312/265.4 X |
| 5,228,762 | 7/1993 | Mascrier | 312/265.4 |
| 5,380,083 | 1/1995 | Jones et al. | 312/265.4 X |
| 5,639,150 | 6/1997 | Anderson et al. | 312/265.4 X |

FOREIGN PATENT DOCUMENTS

| | | | |
|---|---|---|---|
| 2265302 | 10/1975 | France | 312/265.4 |
| 2251410 | 4/1973 | Germany | 312/265.4 |

*Primary Examiner*—Peter M. Cuomo
*Assistant Examiner*—Hanh V. Tran
*Attorney, Agent, or Firm*—Andrew J. Dillon; Matthew J. Bussan

[57] ABSTRACT

An enclosure and method for enclosing electronic devices. The enclosure includes channel-shaped members that each have a convex side and a concave side. The enclosure further includes a substantially planar outer surface and an attachment device for attaching the substantially planar outer shell to the concave side of the channel-shaped member such that a rigid, enclosed, substantially tubular structural member is formed, thereby forming a rigid chassis. Additionally, the attachment device includes a trench-shaped member, attached to said substantially planar outer shell, and located between the channel-shaped member and the substantially planar outer shell. The trench-shaped member also includes a fixed device for temporarily fixing the trench-shaped member to the concave side of the channel-shaped member. The enclosure includes four channel-shaped members, such that each channel-shaped member includes a corner post positioned within the enclosure apparatus to form a substantially rectangular structure. In addition, each trench-shaped member includes a stiffener hat section. The substantially planar outer shell includes a removable side cover assembly that has an outer surface and an inner surface, such that the stiffener hat section is affixed to the inner surface and received in an open channel of the corner post.

13 Claims, 5 Drawing Sheets

SEMI-MONOCOQUE APPARATUS AND METHOD FOR AN ELECTRONIC DEVICE ENCLOSURE

TECHNICAL FIELD

The present invention relates generally to electronic systems. In particular, the invention relates to enclosures for electronic systems. Still more particularly, the invention relates to enclosures that consume minimal space and provide structural stability to internal electronic devices.

DESCRIPTION OF THE RELATED ART

Current electronic systems, including data-processing systems, require package systems that are designed to be compact and easy to service and upgrade at the end user site. The compact designs are necessary because such designs are easily utilized in office environments and industrial sites where the availability of space is limited or special environmental conditions are required by the data-processing systems, such as, for example, mainframe computers, mid-range computers, and electronic devices such as oscilloscopes. In addition, electronic systems, such as data-processing systems, typically come with a number of options, and the end user may wish to add or remove options at any time after initial installation. It is also desirable that the field service representative or end user be able to perform these changes in the minimum time possible, without the need for special tools.

In the electronics and computer industry, there exists a continuing need to shrink the size of electronic device enclosures. Electronic and computer consumers increasingly desire devices which occupy less floor space than previously designed devices, and which also decrease shipping size and volume. The challenge to designers of electronic and computer devices has been to design an electronic device enclosure frame that provides structural integrity to the frame, while maintaining the components of the frame such as corner posts, shelving, and so forth, in as compact an arrangement as possible.

On most electronic device enclosures, side covers typically serve as decorative features, while occasionally providing electromagnetic interference (EMI) barriers. However, such structures rarely serve as frame structural members. In previous designs of electronic device and computer enclosures, side covers have been utilized to support the enclosure structure (i.e., frame). Because of this structure, the side covers were permanently fixed and could not be readily removed from the enclosed machine (i.e., electronic or computer device) to service or access the machine. The challenge to designers of electronic device enclosures has been to devise a structure which maximizes the structural strength of an electronic device enclosure frame utilizing the smallest cross-section possible. In addition, such a challenge has included providing side, front, and rear access for such an electronic device enclosure frame. In order to provide side, front, and rear access for an electronic device enclosure frame, the cover of such an electronic device enclosure must be readily removable.

A typical electronic device enclosure utilized in the art of electronic device enclosures is represented by a structure that allows for the entire frame corner post and side cover portions to be no more than 20 mm wide. Due to material restrictions, the thickest material available for such an electronic device enclosure is approximately 1.9 mm. In addition, each 815-mm-long frame cover is required to support 60 lbs. during an 80 g dynamic (i.e., impact) load. In other words, the frame must withstand up to 4800 lbs. in dynamic compression and buckling forces. Such measurements are difficult to implement without sacrificing space and structural integrity.

In the past, tubular steel stock corner posts have been utilized by designers of electronic device enclosures to increase a cross-sectional strength in a compact profile. However, such an approach is not only costly due to manufacturing complexities and the need for additional corrosion treatment, but the largest available standard tubular cross-section (i.e., within the aforementioned 20-mm-width restriction) is ¾"×¾". Such a cross-section only has a moment of inertia of 8628 $mm^4$, which is not sufficient enough to increase cross-sectional strength as desired. Thus, standard tubular stock, well-known in the metal arts, is not a viable option. Non-standard tubular stock would not only present a great cost component, but also result in increased manufacturing complexities and the need for corrosion treatment, a costly and time consuming process.

Additional sheet metal channels can be welded to a main corner post, but this adds to the structural cost. In addition, the heat generated by welding tends to warp the structure, creating flatness and tolerance problems. Thus, welding is not a viable option. Permanently-attached (i.e., welded) covers have been utilized in the past. However, such permanently attached covers do not satisfy the need for a side access to the internal machinery enclosed within an electronic device enclosure. Thus, a permanently attached (e.g., welded) cover also is not a viable option.

The challenge to designers of electronic and computer devices has been to design a frame for an electronic device enclosure that provides structural integrity to the frame, while maintaining the components of the frame such as corner posts, shelving, and so forth, in as compact an arrangement as possible. Such an electronic device enclosure can be achieved by incorporating monocoque design techniques. Monocoque design techniques have been utilized for years on structures such as bridges, cars, locomotives, and so forth. A monocoque is a metal structure that carries all or most of the stresses to which the body is subjected.

From the foregoing, it can be seen that a need exists for a compact electronic device enclosure design. In addition, a need exists for electronic and computer devices that occupy less floor space than previously designed devices, and that also decrease shipping size and volume. Such devices can be achieved by designing compact electronic device enclosures for electronic and computer devices. It is believed that the present invention described herein is the first application of monocoque design techniques to the art of electronic and computer enclosure design.

SUMMARY OF THE INVENTION

It is therefore an object of the present invention to provide an improved enclosure apparatus.

It is another object of the present invention to provide an improved electronic device enclosure for electronic systems.

It is yet another object of the present invention to provide an improved electronic device enclosure that consumes minimal space and provides structural stability to internal electronic devices.

It is still another object of the present invention to provide an improved electronic device enclosure that consumes minimal space and provides structural stability to internal electronic devices, and which incorporates monocoque structural design techniques.

The above and other objects are achieved as is now described. An enclosure and method are disclosed for enclosing electronic devices. The enclosure includes channel-shaped members that each have a convex side and a concave side. The enclosure further includes a substantially planar outer surface and an attachment device for attaching the substantially planar outer shell to the concave side of the channel-shaped member such that a rigid, enclosed, substantially tubular structural member is formed, thereby forming a rigid chassis. Additionally, the attachment device includes a trench-shaped member, attached to said substantially planar outer shell, and located between the channel-shaped member and the substantially planar outer shell. The trench-shaped member also includes a fixed device for temporarily fixing the trench-shaped member to the concave side of the channel-shaped member. The enclosure includes four channel-shaped members, such that each channel-shaped member includes a corner post positioned within the enclosure apparatus to form a substantially rectangular structure. In addition, each trench-shaped member includes a stiffener hat section. The substantially planar outer shell includes a removable side cover assembly that has an outer surface and an inner surface, such that the stiffener hat section is affixed to the inner surface and received in an open channel of the corner post. The corner posts further can include holes for receiving screws. Additionally, the fixed device includes screws passing through the holes for receiving screws, such that the screws are threaded into the holes within the hat section to removably secure the removable side cover assembly to the corner post.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
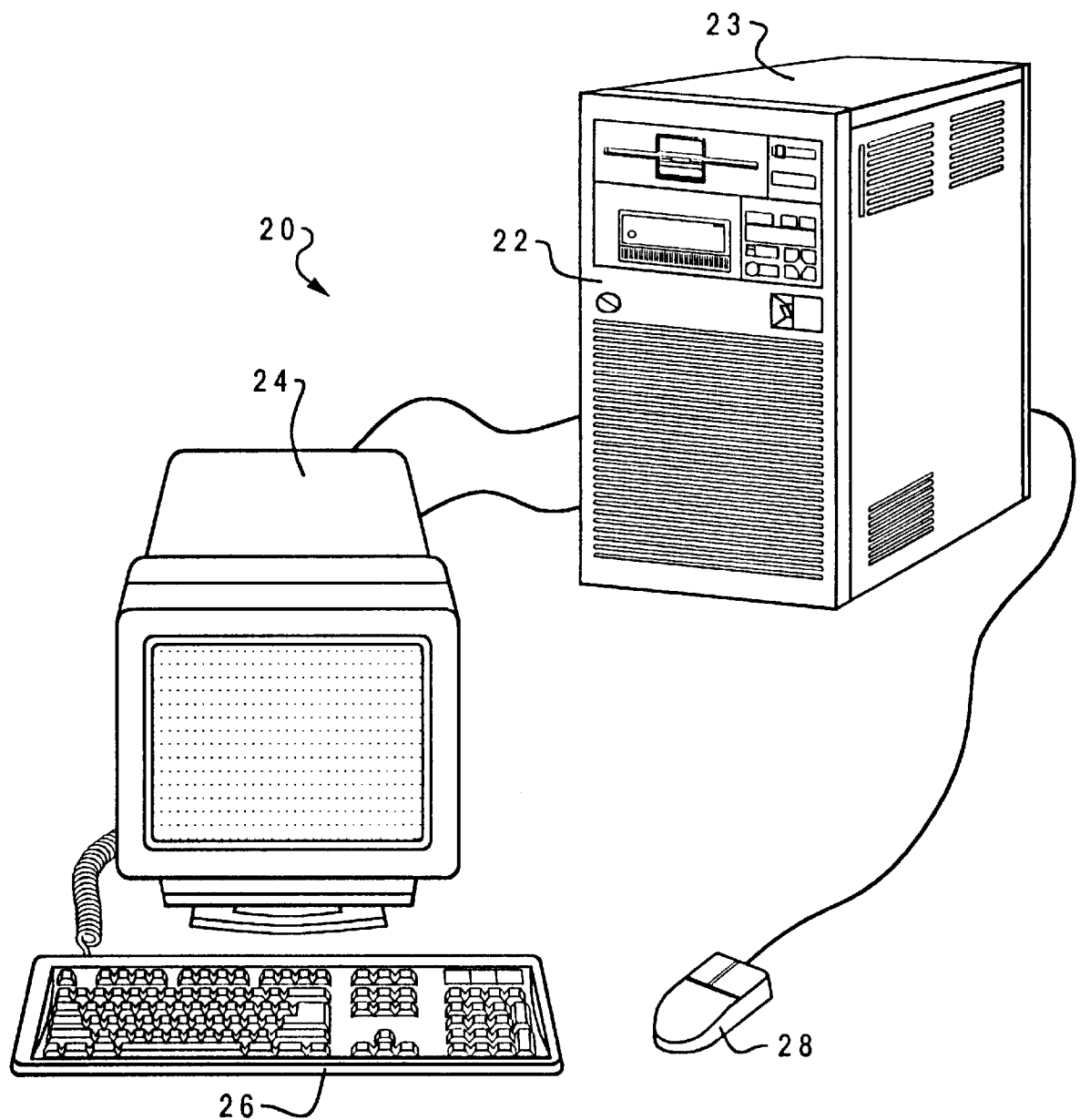
FIG. 1 depicts a pictorial representation of a data-processing system which may be implemented in accordance with a preferred embodiment of the present invention.

With reference now to the figures and in particular with reference to FIG. 1, there is depicted a pictorial representation of a data-processing system which may be implemented in accordance with a preferred embodiment of the present invention. A personal computer 20 is depicted which includes a system unit 22, a video display terminal 24, a keyboard 26, and a mouse 28. Computer 20 may be implemented utilizing any suitable computer such as the IBM Aptiva computer, IBM AS/400 Advanced Series computer, or an IBM RISC SYSTEM/6000 computer, all products of International Business Machines Corporation, located in Armonk, N.Y. "Aptiva," "AS/400 Advanced Series," and "RISC SYSTEM/6000" are all trademarks of International Business Machines Corporation. Personal computer 20 is but one example of an electronics device or system that may be implemented as a preferred embodiment of the present invention. It will be appreciated by those skilled in the art that completely different electronic devices can be implemented in accordance with a preferred embodiment of the present invention. For example, electronic devices ranging from oscilloscopes to radiation detectors can also be implemented in accordance with a preferred embodiment of the present invention.

Figure 2:
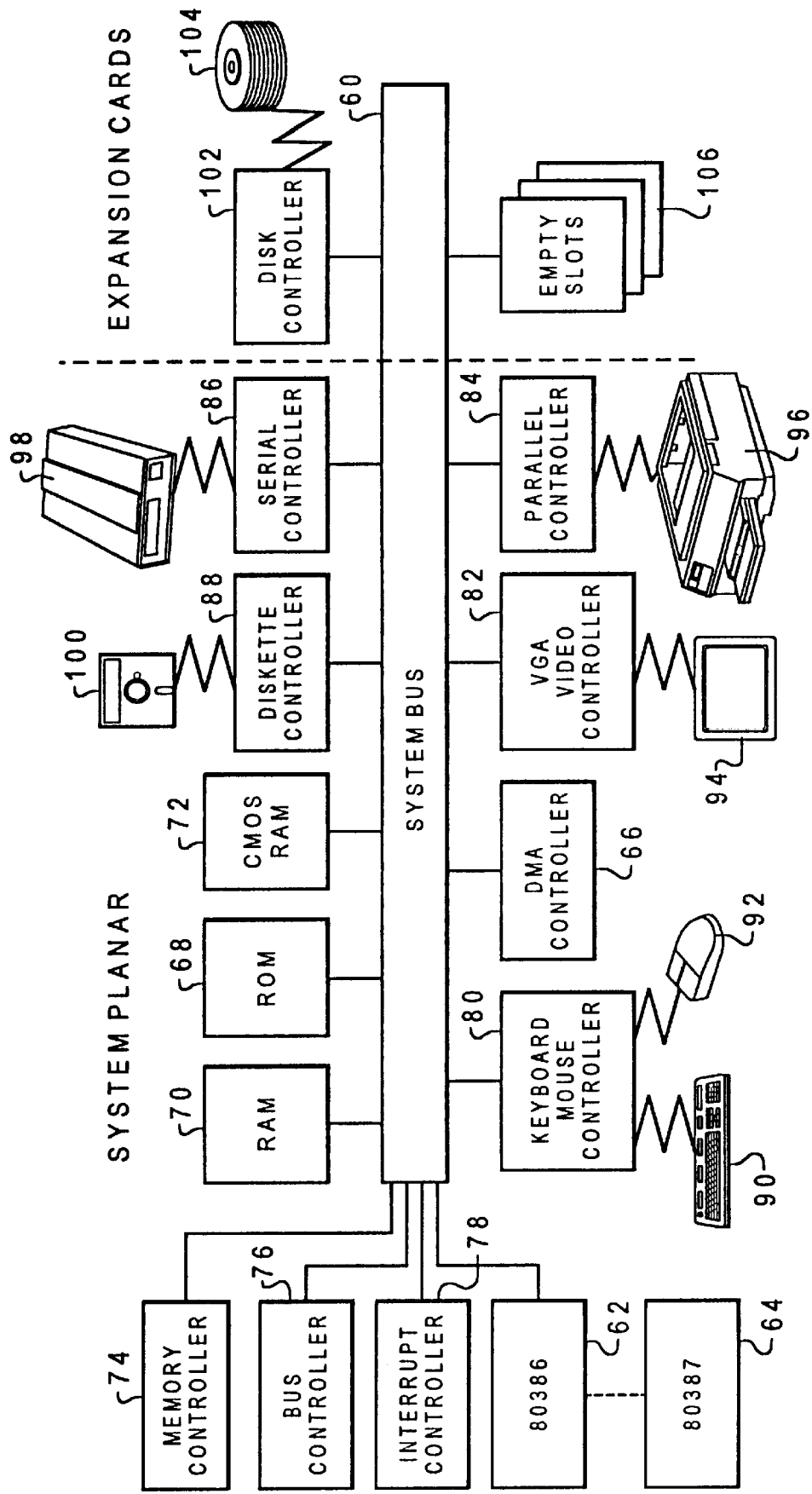
FIG. 2 illustrates a block diagram of selected components in a personal computer in Which a preferred embodiment of the present invention may be implemented.

Referring now to FIG. 2, there is depicted a block diagram of selected components in personal computer 20 in which a preferred embodiment of the present invention may be implemented. System unit 22 preferably includes a system bus 60 for interconnecting and establishing communication between various components in system unit 22. Microprocessor 62 is connected to system bus 60 and also may have numeric coprocessor 64 connected to it. Direct memory access (DMA) controller 66 also is connected to system bus 60 and allows various devices to appropriate cycles from microprocessor 62 during large I/O transfers.

Read-only memory (ROM) 68 and random-access memory (RAM) 70 are also connected to system bus 60. ROM 68 contains the power-on self-test (POST) and the Basic Input/Output System (BIOS) which control hardware operations, such as those involving disk drives and the keyboard. Read-only memory (ROM) 68 is mapped into the microprocessor 62 address space in the range from 640K to 1 megabyte. CMOS RAM 72 is attached to system bus 60 and contains system configuration information.

Also connected to system bus 60 are memory controller 74, bus controller 76, and interrupt controller 78 which serve to aid in the control of data flow through system bus 60 between various peripherals, adapters, and devices. System 22 also contains various input/output (I/O) controllers such as: keyboard and mouse controller 80, video controller 82, parallel controller 84, serial controller 86, and diskette controller 88. Keyboard and mouse controller 80 provide a hardware interface for keyboard 90 and mouse 92. Video controller 82 provides a hardware interface for video display terminal 24. Parallel controller 84 provides a hardware interface for devices such as printer 96. Serial controller 86 provides a hardware interface for devices such a modem 98. Diskette controller 88 provides a hardware interface for floppy disk unit 100. Expansion cards also may be added to system bus 60, such as disk controller 102, which provides a hardware interface for hard disk unit 104. Empty slots 106 are provided so that other peripherals, adapters, and devices may be added to system unit 22.

Those skilled in the art will appreciate that the hardware depicted in FIG. 2 may vary for specific applications. For example, other peripheral devices such as: optical disk media, audio adapters, or chip programming devices such as a PAL or EPROM programming device and the like also may be utilized in addition to or in place of the hardware already depicted.

Figure 3:
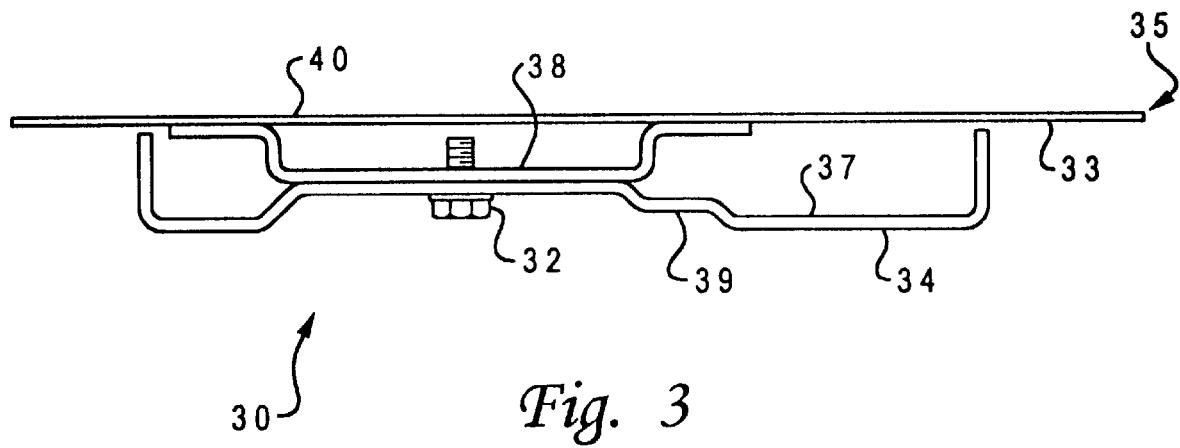
FIG. 3 depicts a planar cross-sectional view of a portion of a frame structure in accordance with a preferred embodiment of the present invention.

FIG. 3 is a planar cross-sectional view of a portion 30 of a frame structure provided in accordance with a preferred embodiment of the present invention. In order to provide the most compact frame structure possible, yet not sacrifice structural integrity, a side cover stiffener hat section 38 is nested into a frame corner post 34 in order to increase the cross-sectional inertia of an electronics enclosure structure. In order to satisfy "side-access" entry requirements, the hat section 38 is affixed to corner post 34 utilizing screws 32 along the length of frame corner post 34. Side cover 35 forms part of a substantially planar outer shell (not shown in FIG. 3). Side cover 35 has an outer surface 40 and an inner surface 33. Inner surface 33 is connected to hat section 38. One technique that can be utilized in accordance with the present invention is that of spot-welding. Thus, inner surface 33 can be spot-welded to hat section 38. Spot-welding is one technique that, potentially, can be utilized to form this connection, but is not a necessary feature of the present invention. Corner post 34 forms a vertical channel member and includes a concave side 37 and a convex side 39. Hat section 38 is connected to corner post 34 at the concave side 37 of corner post 24. Corner post 34, together with hat section 38 and side cover 35 form a rigid, enclosed, substantially tubular structural member.

Figure 4:
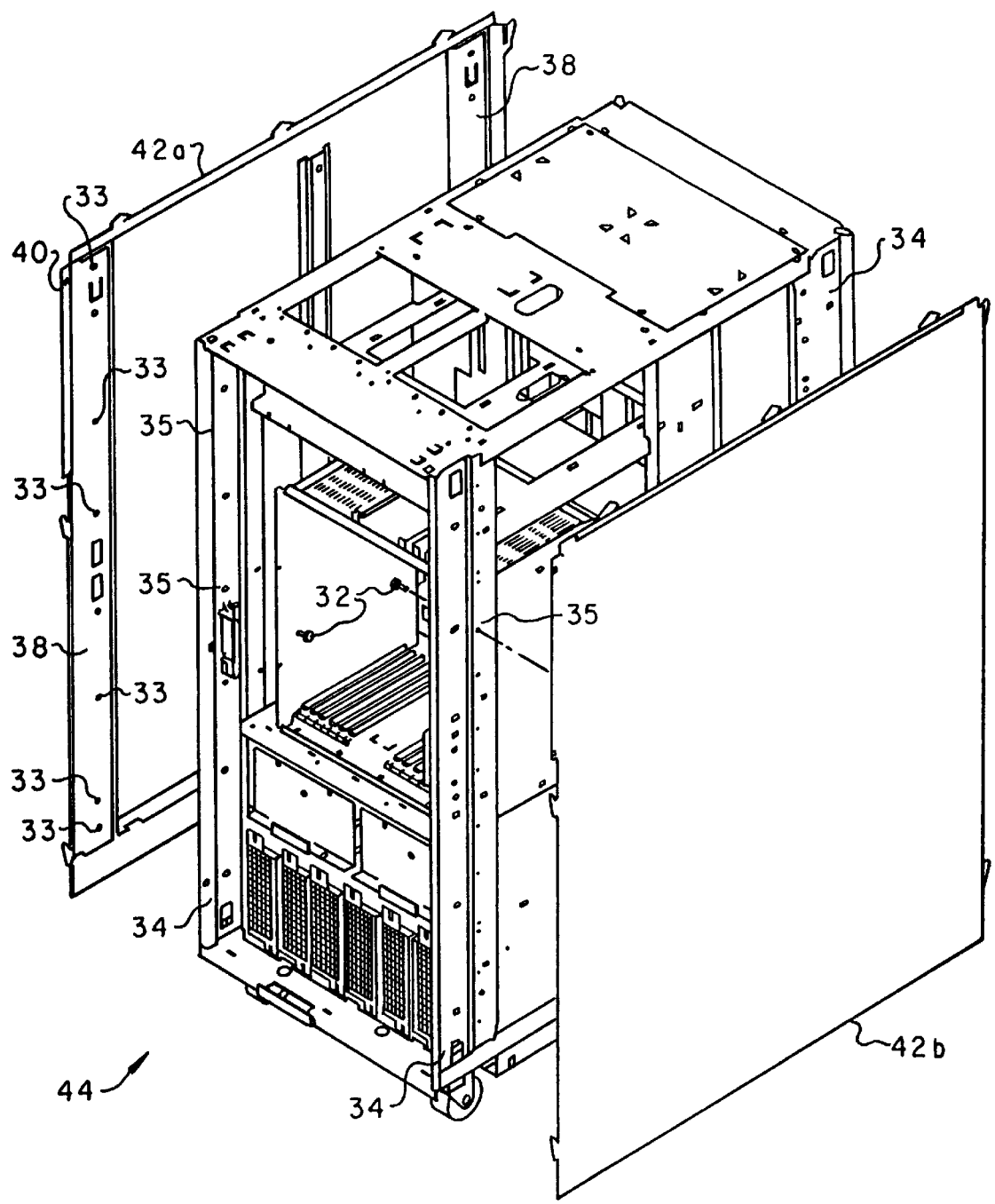
FIG. 4 illustrates a pictorial side view illustrative of an electronics unit in accordance with a preferred embodiment of the present invention.

FIG. 4 illustrates a pictorial side view illustrative of an electronics unit 44 in accordance with a preferred embodiment of the present invention. The electronics unit 44 can be included with a computer system such as computer system 20 of FIG. 1. In particular, electronics unit 44 is analogous to system unit 22 of FIG. 1 in that hardware components such as those depicted in FIG. 2 can be located within the interior of electronics unit 44. For example, electronics unit 44 may house a computer system such as computer system 20 of FIG. 1. Housed within electronics unit 44 may be a motherboard containing much of the circuitry for information processing and providing connects for adapter cards to be connected to computer system 20. A power supply, a hard disk drive, and a floppy disk drive all may be included within electronics unit 44. Screws 32 are affixed to corner posts 34 and to stiffener hat sections 38 in order to satisfy "side-access" requirements. Five easily accessible screws can be provided along the length of corner posts 34.

Depicted in FIG. 4 are two vertical side covers 42a and 42b. Frame corner posts 34 provide vertical support to both electronics unit 44 and side covers 42a and 42b. Although only three frame corner posts 34 are depicted in FIG. 4, a total of four frame corner posts provide support for electronics unit 44. One of the four corner posts 34 is not shown in FIG. 4 due to the angular view of electronics unit 44. Side covers 42a and 42b form portions of a substantially planar outer shell for electronics unit 44. Each side cover 42a and 42b include a side cover stiffener hat section 38 and holes 33 for receiving screws such as screws 32. Only two hat stiffener hat sections 38 are shown in FIG. 4, although four stiffener hat sections 38 provide support for electronics unit 44. The other two hat sections are not shown because opposite sides of side covers 42a and 42b are shown. Side cover 42b includes stiffener hat sections that oppose stiffener hat sections 38. Each side cover stiffener hat section 38 forms a trench-shaped member. Each frame corner post 34 forms a channel-shaped member having a concave side and a convex side. The trench-shaped members also have a convex side and a concave side, as shown in FIG. 3. However, the concave side of the channel-shaped member is larger than the concave side of the trench-shaped member. Thus, as depicted in FIG. 4, side covers 42a and 42b actually provide structural support to electronics unit 44.

On most electronic device enclosures, side covers merely serve as decorative features, although occasionally as EMI barriers. Such side covers, however, serve as frame structural members. Because side covers 42a and 42b are easily removable, a service technician has direct access to the interior of electronics unit 44 without the necessity of removing an outer shell in a manner that could lead to damage of interior hardware components.

Figure 5:
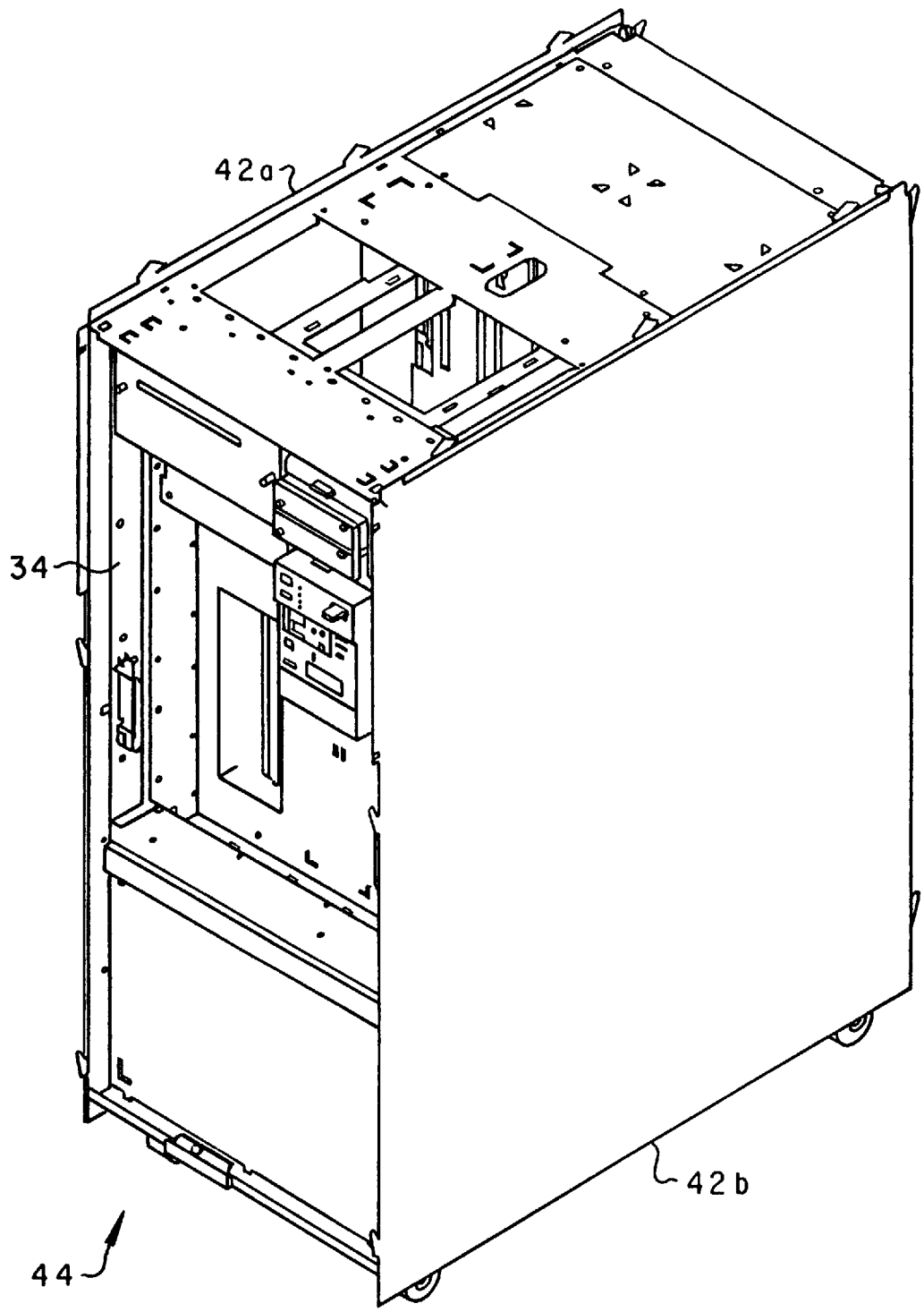
FIG. 5 depicts a pictorial side view illustrative of an enclosed electronics unit in accordance with a preferred embodiment of the present invention.

FIG. 5 depicts a pictorial side view illustrative of an enclosed electronics unit 44 in accordance with a preferred embodiment of the present invention. In FIG. 4 and FIG. 5, like parts are indicated by like numbers. Thus, FIG. 5 illustrates side covers 42a and 42b in an enclosed position. Portions of the frame corner posts 34 are also depicted in FIG. 5. Based on the foregoing description, one skilled in the art will appreciate that the inclusion of side covers 42a and 42b into electronics unit 44 provides structural integrity to the frame of electronics unit 44, while maintaining the components of the frame such as corner posts, shelving, and so forth, in as compact an arrangement as possible.

Such an electronic device enclosure is achieved by incorporating monocoque design techniques. A monocoque is a metal structure which absorbs all or most of the stresses to which the body is subjected. Electronics unit 44 can be described as incorporating a semi-monocoque structure. The prefix "semi" is utilized because side covers 42a and 42b are easily removable, yet keep the cross-sectional profile of electronics unit 44 compact, while providing increased structural strength via a moment of inertia. It is anticipated in a preferred embodiment of the present invention that the utilization of pre-plated sheet metal for side covers 42a and 42b will provide manufacturing flexibility and proper corrosion treatment. Side covers 42a and 42b additionally can provide EMI protection to electronic components housed within the interior of electronics unit 44.

The example depicted in FIG. 4 and FIG. 5 can be described as providing a semi-monocoque electronics enclosure having a compact frame structure, structural strength and easily removable side covers. The electronics enclosure for electronics unit 44 includes two or more vertical frame corner posts 34, each shaped to define an open channel. In addition, the electronics enclosure for electronics unit 44 further includes a removable side cover assembly having side cover sheets (i.e., side covers 42a and 42b) that each include two vertical side cover stiffener hat sections 38 affixed to each side cover sheet. The stiffener hat sections 38 are positioned on each side cover 42a and 42b so that the stiffener hat sections 38 are received in the open channels of the frame corner posts 34. The removable side cover assembly is removably secured to the frame corner posts 34 by a number of screws 32 passing through holes 35 in the frame corner posts 34 and threaded into holes 33 in stiffener hat sections 38.

While the invention has been shown and described with reference to a preferred embodiment, it will be understood by those skilled in the art that various changes in form and detail may be made therein without departing from the spirit and scope of the invention. For example, electronics unit 44 may house components of an electronic device such as an oscilloscope instead of a computer system. In addition, additional stiffener hat sections and posts may be provided to provide increased support. Also, a fewer or a greater number of screws and holes may be provided, depending upon a desired implementation of a preferred embodiment of the present invention. Such a choice is left to a user attempting to practice the general design taught by the present invention.

What is claimed is:

1. A semi-monocoque enclosure apparatus for enclosing electronic devices, comprising:

at least one channel-shaped member having a convex side and a concave side;

a substantially planar outer shell comprising at least one removable side cover assembly having an outer surface and an inner surface, wherein said at least one removable side cover assembly provides structural support to said semi-monocoque enclosure apparatus; and attachment means for attaching said substantially planar outer shell to said concave side of said at least one channel-shaped member such that a rigid, enclosed, substantially tubular structural member is formed, thereby forming a rigid chassis that structurally supports electronic components contained therein; wherein said attachment means further comprises a trench-shaped member comprising a stiffener hat section attached to said substantially planar outer shell, and located between said at least one channel-shaped member and said substantially planar outer shell; and fixed means for temporarily fixing said trench-shaped member to said concave side of said at least one channel-shaped member.

2. The semi-monocoque enclosure apparatus of claim 1 wherein said semi-monocoque enclosure apparatus includes four channel-shaped members, wherein each channel-shaped member comprises a corner post positioned within said semi-monocoque enclosure apparatus to form a substantially rectangular structure said corner post including holes for receiving screws.

3. The semi-monocoque enclosure apparatus of claim 2 wherein said stiffener hat section is affixed to said inner surface of said at least one removable side cover assembly, such that said stiffener hat section is received in an open channel of said corner post.

4. The semi-monocoque enclosure apparatus of claim 3 wherein said fixed means comprises:

a plurality of screws passing through said holes of said corner and threaded into said holes within said hat section to removably secure said at least one removable side cover assembly to said corner post.

5. A method for designing a semi-monocoque enclosure apparatus for enclosing electronic devices, comprising:

providing at least one channel-shaped member having a convex side and a concave side;

providing a substantially planar outer shell comprising at least one removable side cover assembly having an outer surface and an inner surface, wherein said at least one removable side cover assembly provides structural support to said semi-monocoque enclosure apparatus;

utilizing an attachment device to attach said substantially planar outer shell to said concave side of said at least one channel-shaped member such that a rigid, enclosed, substantially tubular structural member is formed, thereby forming a rigid chassis that structurally supports electronic components contained therein; wherein said attachment means further comprises a trench-shaped member comprising a stiffener hat section attached to said substantially planar outer shell, and located between said at least one channel-shaped member and said substantially planar outer shell; and fixed means for temporarily fixing said trench-shaped member to said concave side of said at least one channel-shaped member shell; and fixed device for temporarily fixing said trench-shaped member to said concave side of said at least one channel-shaped member.

6. The method of claim 5 further comprising the step of:

providing four channel-shaped members within said semimonocoque enclosure apparatus, wherein each channel-shaped member comprises a corner post positioned within said semi-monocoque enclosure apparatus to form a substantially rectangular structure, said corner post including holes for receiving screws.

7. The method of claim 6 further comprising the step of affixing said stiffener hat section to said inner surface, such that said stiffener hat section is received in an open channel of said corner post.

8. The method of claim 7 further comprising the step of:

configuring said fixed device to comprise a plurality of screws passing through said holes and threaded into said holes within said hat section to removably secure said at least one removable side cover assembly to said corner post.

9. A semi-monocoque enclosure apparatus for enclosing electronic devices, comprising:

at least one channel-shaped member having a convex side and a concave side;

a substantially planar outer shell comprising at least one removable side cover assembly having an outer surface and an inner surface; and attachment means for attaching said substantially planar outer shell to said concave side of said at least one channel-shaped member such that a rigid, enclosed, substantially tubular structural member is formed, thereby forming a rigid chassis, said attachment means comprising:

a trench-shaped member, attached to said substantially planar outer shell, and located between said at least one channel-shaped member and said substantially planar outer shell, wherein said trench-shaped member includes a stiffener hat section, wherein said stiffener hat section is affixed to said inner surface such that said stiffener hat section is received in an open channel of a corner post; and fixed means for temporarily fixing said trench-shaped member to said concave side of said at least one channel-shaped member; and four channel-shaped members, wherein each channel-shaped member comprises a corner post positioned within said semi-monocoque enclosure apparatus to form a substantially rectangular structure, said corner post having holes for receiving screws.

10. The semi-monocoque enclosure apparatus of claim 9 wherein said fixed means comprises a plurality of screws passing through said holes and threaded in holes within said hat section to removably secure said at least one removable side cover assembly to said corner post.

11. A method for designing a semi-monocoque enclosure apparatus for enclosing electronic devices, comprising:

providing at least one channel-shaped member having a convex side and a concave side;

providing a substantially planar outer shell; and utilizing an attachment device to attach said substantially planar outer shell to said concave side of said at least one channel-shaped member such that a rigid, enclosed, substantially tubular structural member is formed, thereby forming a rigid chassis, said attachment device comprising:

a trench-shaped member, attached to said substantially planar outer shell, and located between said at least one channel-shaped member and said substantially planar outer shell, wherein said trench-shaped member comprises a stiffener hat section;

fixed device for temporarily fixing said trench-shaped member to said concave side of said at least one channel-shaped member; and providing four channel-shaped members, wherein each channel-shaped member comprises a corner post positioned within said semi-monocoque enclosure apparatus to form a substantially rectangular structure, said corner post having holes for receiving screws.

12. The method of claim 11 wherein the step of providing said substantially planar outer shell, further comprises the step of:

providing at least one removable side cover assembly having an outer surface and an inner surface.

13. The method of claim 12 further comprising the steps of:

positioning said fixed device within said semi-monocoque enclosure apparatus such that said fixed device comprises a plurality of screws passing through said holes of said corner post and threaded into holes within said hat section to removably secure said at least one removable side cover assembly to said corner post; and affixing said stiffener hat section to said inner surface of said at least one removable side cover such that said stiffener hat section is received in an open channel of said corner post.

* * * * *

UNITED STATES PATENT AND TRADEMARK OFFICE
CERTIFICATE OF CORRECTION

PATENT NO. : 5,890,783
DATED : April 06, 1999
INVENTOR(S) : Raymond Floyd Babcock, Stephen Peter Mroz and Kenneth Robert Peters It is certified that error appears in the above-identified patent and that said Letters Patent is hereby corrected as shown below:

Claim 5, Col. 7, Line 52 after contained therein replace "wherein" with --and further comprising the steps of: configuring said attachment device such that said attachment device comprises: a trench-shaped member comprising a stiffener hat section, attached to said substantially planar outer shell, and located between said at least one channel-shaped member and said substantially planar outer shell; and fixed device for temporarily fixing said trench-shaped member to said concave side of said at least one channel-shaped member--.

Claim 5, Col. 7, Lines 53 through 62, delete in their entirety.

Signed and Sealed this

Fifth Day of October, 1999

Attest:

Q. TODD DICKINSON

*Attesting Officer*    *Acting Commissioner of Patents and Trademarks*